United States Patent [19]

Morrow et al.

[11] 4,035,733
[45] July 12, 1977

[54] PULSE SIGNAL CONDITIONING CIRCUIT

[75] Inventors: Robert S. Morrow, Columbus; Lloyd D. Penn, Johnstown, both of Ohio

[73] Assignee: IRD Mechanalysis, Inc., Columbus, Ohio

[21] Appl. No.: 672,013

[22] Filed: Mar. 30, 1976
(Under 37 CFR 1.47)

Related U.S. Application Data

[60] Continuation-in-part of Ser. No. 637,751, Dec. 4, 1975, which is a division of Ser. No. 420,594, Nov. 30, 1973, Pat. No. 3,938,394.

[51] Int. Cl.² .................................. H03K 5/08
[52] U.S. Cl. ............................ 328/34; 307/362;
307/236; 307/265; 307/267; 307/268;
328/58; 328/164

[58] Field of Search ............... 307/23 ST, 265, 267,
307/236, 273, 268; 328/34, 58, 207, 162–164,
118, 115

[56] References Cited

U.S. PATENT DOCUMENTS

| 3,448,296 | 6/1969 | Schwaninger | 307/235 T |
|---|---|---|---|
| 3,531,661 | 9/1970 | Boyden | 307/267 |
| 3,697,782 | 10/1972 | Matouka | 307/236 |
| 3,790,894 | 2/1974 | Iizuka et al. | 328/34 |

Primary Examiner—Stanley D. Miller, Jr.
Attorney, Agent, or Firm—Harry B. Keck; George E. Manias

[57] ABSTRACT

A pulse signal conditioning circuit. Repetitive pulse signals can be sharpened and freed of accompanying, unwanted noise manifestations by means of a network of steering diodes and constant current diodes feeding a comparator circuit producing sharp, uniform pulses.

1 Claim, 3 Drawing Figures

PULSE SIGNAL CONDITIONING CIRCUIT

CROSS-REFERENCE TO RELATED APPLICATIONS

This is a continuation-in-part of Ser. No. 637,751, filed Dec. 4, 1975, which is a division of Ser. No. 420,594, filed Nov. 30, 1973, now U.S. Pat. No. 3,938,394.

BACKGROUND OF THE INVENTION

1. Field of the Invention

The invention relates to electronic circuitry for electro-mechanical balancing.

2. Description of the Prior Art

Rotating bodies exhibiting mechanical vibrations as a result of mass unbalance, or mass eccentricity as it is sometimes called, worn bearings, bent shafts, misaligned shafts, et cetera. The manifestations of unbalance are cyclically repetitive. Numerous devices have been proposed for measuring the instantaneous displacement, velocity or acceleration of the rotating body and for converting such measured function into a corresponding cyclic electrical signal which can be analyzed.

The electrical signal contains pulses related to cyclically repetitive incidents and also contains some surface noise components and spurious components which interfere with the principal pulses to be investigated.

SUMMARY OF THE INVENTION

According to this invention, there is provided a reference pulse conditioning circuit to supply constant amplitude pulses and to eliminate noise and spurious triggers from the system. The input pulses are delivered through a network of steering diodes and constant current diodes to a comparator integrated circuit which generates a trigger pulse only when the input signal exceeds a threshold voltage which can be adjusted for the unit. Thus, the output pulse signal is derived in the form of a series of sharp uniform pulses.

BRIEF DESCRIPTION OF THE DRAWING(S)

DESCRIPTION OF THE PREFERRED EMBODIMENTS(S)

Figure 1:
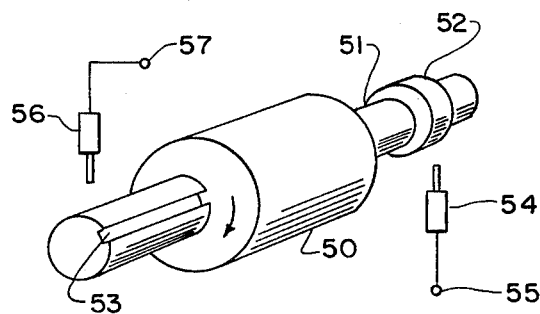
FIG. 1 is a schematic illustration of a typical vibration analysis installation showing a typical rotor and typical signal pick-up devices.

Referring to FIG. 1, a typical overall environment of the present invention is broadly illustrated. In FIG. 1, a rotor 50 is mounted for rotation about a shaft 51 mounted in bearings 52 and having a keyway 53. One electromagnetic transducer 54 generates an oscillating electrical signal at a terminal 55 which corresponds to the instantaneous mechanical vibrations of the bearing 52, as shown in FIG. 1. The transducer 54 may be a seismic generator of the type shown in U.S. Pat. No. 3,157,852 which generates signal proportion of the instantaneous velocity of the bearing 52. The transducer 54 may be an accelerometer which generates an oscillatory signal corresponding to the instantaneous acceleration of the bearing 52. The transducer 54 may be a noncontact sensor of the type described in the U.S. Pat. No. 3,521,158 which generates a signal proportional to the instantaneous displacement of the bearing 52. Regardless of the particular type of electromagnetic transducer 54, a vibration corresponding signal is applied to a terminal 55 hereinafter referred to as a vibration signal.

A second signal generator 56 generates a pulse signal for each rotation of the rotor 50 and generates that pulse at the same angular location of the rotor 50 in each cycle. It is this pulse signal with which the present invention is concerned. Typically, the transducer 56 is a non-contact transducer which is responsive to the presence of the keyway 53 in immediate proximity to the sensing tip of the transducer 56. Thus, with each rotation of the rotor 50 a pulse will be generated by the transducer 56 and applied to the reference terminal 57 at the instant when the keyway 53 is proximate to the transducer 56. Other transducers might employ photoelectric response to a bright spot or a dark spot which is applied to a single spot on the periphery of the rotor 50 or the shaft 51. The two signals at the terminal 55, 57 are the input signals for the present apparatus.

Figure 2:
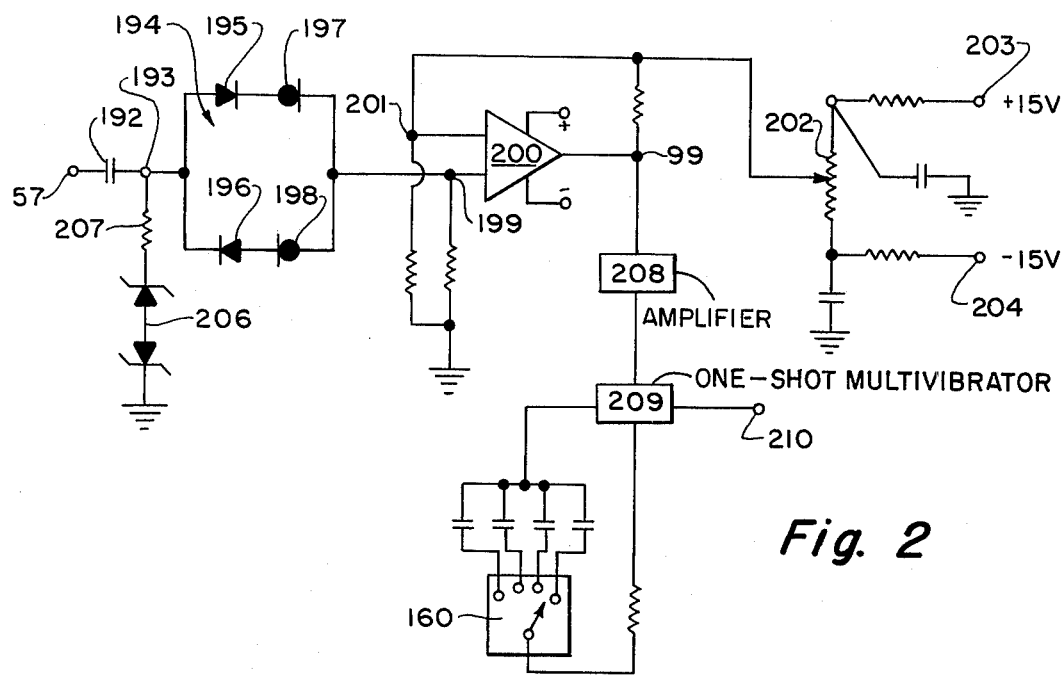
FIG. 2 is a schematic illustration of a pulse signal conditioning circuit.

The purpose of the input circuitry of FIG. 2 is to condition an input reference signal to produce a clean pulse corresponding with the principal pulse source and to eliminate electrical signals resulting from noise and surface discontinuities. The input signal is delivered from a pulse pickup terminal 57 through a coupling capacitor 192 to the input terminal 193 of the input signal circuit. The input terminal 193 is connected to a circuit 194 including a pair of steering diodes 195, 196 and a pair of constant current diodes 197, 198. The steering diodes 195, 196 accommodate both positive and negative pulses. The other end of the circuit 194 is connected to a positive terminal 199 of a comparator integrated circuit 200. The negative terminal 201 of the comparator 200 is connected to a voltage divider 202 which is connected to a positive terminal 203 and a negative terminal 204. The voltage divider 202 applies a pre-selected threshold voltage to the negative terminal 201 of the comparator 200. The of the reference signal circuit at the output terminal 99 is a pulse of constant amplitude corresponding to the input pulses applied from the pulse signal terminal 57. It will be observed that the terminal 193 is protected from overload voltages by a pair of back-to-back Zener diodes 206 and a biasing resistor 207. The circuitry shown in FIG. 2 in effect is a filter for the pulse input signals. Spurious signals of low amplitude are attenuated in the circuit. The clean pulse input signal is applied to an terminal 99.

Figure 3:
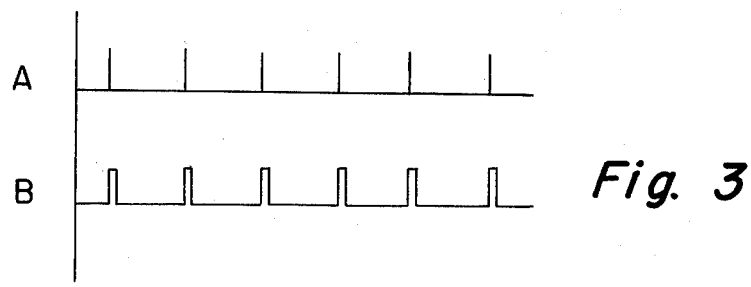
FIG. 3 is a graphical presentation of two wave forms appearing in the circuitry.

The terminal 99 receives a clean input pulse signal having a single pulse per revolution of rotating body. This pulse is shown as a wave form A of FIG. 3. The pulse is applied through an amplifier 208 to a one shot multi-vibrator 209 which develops a predetermined specific width pulse for each of the several filter frequency bands. The width of the pulse is about 1/1000 of the cycle, i.e., the pulse-to-pulse spacing. The pulse width from the one shot multi-vibrator 209 is determined by a setting of a switch 160 which introduces an appropriate time-delay capacitor into the circuitry of the multi-vibrator 209 to establish the desired pulse duration (width). The resulting signal at the output terminal 210 thus is a sharp pulse having a width of approximately 1/1000 of the cycle. This pulse signal is indicated as wave form B in FIG. 3. The pulse duration (width) and the amplitude (voltage) of wave form B is constant.

We claim:

1. Means for providing a clean sharp pulse signal of constant voltage from an input signal containing a series of repetitive pulses along with unwanted noise signal components; including a parallel network having an input terminal and an output terminal and consisting of:

a first channel including a constant current diode and a steering diode connected to pass electrical signals from the said input terminal to the said output terminal;

a second channel including a constant current diode and a steering diode connected to deliver signals from the output terminal to the input terminal;

a comparator circuit connected to deliver a single pulse signal in response to applied inputs exceeding a pre-established threshold value;

means connecting the said output terminal to the input of said comparator circuit;

a multi-vibrator connected to deliver in response to a pulse input, a constant voltage signal for a pre-established duration which is a minor fraction of the pulse-to-pulse spacing of the said input signal;

means connecting the comparator circuit output to the input of the said multi-vibrator.

* * * * *